US007656666B2

(12) United States Patent
Jeong

(10) Patent No.: US 7,656,666 B2
(45) Date of Patent: Feb. 2, 2010

(54) HEAT DISSIPATING STRUCTURE OF INTEGRATED CIRCUIT CHIP OF PLASMA DISPLAY MODULE AND PLASMA DISPLAY MODULE INCLUDING THE SAME

(75) Inventor: Kwang-Jin Jeong, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 158 days.

(21) Appl. No.: 11/436,736

(22) Filed: May 18, 2006

(65) Prior Publication Data

US 2006/0285294 A1 Dec. 21, 2006

(30) Foreign Application Priority Data

Jun. 16, 2005 (KR) ...................... 10-2005-0052018

(51) Int. Cl.
*H05K 7/20* (2006.01)

(52) U.S. Cl. .................. 361/704; 361/719; 348/58; 313/582

(58) Field of Classification Search ............... 361/694, 361/695, 704, 710, 719; 313/46, 613, 582; 345/60, 173; 310/321; 206/587; 349/58–59; 454/184

See application file for complete search history.

(56) References Cited

U.S. PATENT DOCUMENTS

| 6,198,222 | B1 * | 3/2001 | Chang .................... 313/582 |
| 6,366,264 | B1 * | 4/2002 | Kurumada ................ 345/60 |
| 6,833,674 | B2 * | 12/2004 | Kaneko et al. ............. 313/587 |
| 6,971,780 | B2 * | 12/2005 | Lee et al. ................. 362/561 |
| 7,251,140 | B2 * | 7/2007 | Bae et al. ................. 361/719 |
| 7,259,958 | B2 * | 8/2007 | Bang et al. ............... 361/681 |
| 7,262,968 | B2 * | 8/2007 | Chang et al. ............. 361/704 |
| 2003/0090458 | A1 * | 5/2003 | Tajima .................... 345/156 |
| 2005/0067956 | A1 * | 3/2005 | Kim ....................... 313/581 |
| 2005/0083646 | A1 * | 4/2005 | Bae et al. ................. 361/686 |
| 2005/0117304 | A1 * | 6/2005 | Kim ....................... 361/704 |
| 2005/0286228 | A1 * | 12/2005 | Kim ....................... 361/704 |
| 2006/0158851 | A1 * | 7/2006 | Bae et al. ................. 361/700 |
| 2006/0203143 | A1 * | 9/2006 | Shin ....................... 349/58 |
| 2006/0244875 | A1 * | 11/2006 | Ahn ....................... 349/58 |
| 2006/0262241 | A1 * | 11/2006 | Jeong ..................... 349/58 |

FOREIGN PATENT DOCUMENTS

JP H02-121782 10/1990

(Continued)

*Primary Examiner*—Jayprakash N Gandhi
*Assistant Examiner*—Courtney Smith
(74) *Attorney, Agent, or Firm*—Knobbe Martens Olson & Bear LLP

(57) ABSTRACT

A heat dissipating structure of an integrated circuit chip of a plasma display module and a plasma display module including the same are disclosed. In one embodiment, the heat dissipating structure includes: a chassis including a chassis base and a chassis bending portion in which at least one protruding portion is formed and the integrated circuit chip which is mounted on the cassis bending portion and connected to a signal transmitting member. According to one embodiment of the present invention, since the protruding portion is formed in the chassis bending portion on which the integrated circuit chip is formed, the convective heat transfer efficiency is increased and the heat dissipating performance of the integrated circuit chip is improved.

17 Claims, 8 Drawing Sheets

FOREIGN PATENT DOCUMENTS

| | | |
|---|---|---|
| JP | 2001-013883 | 1/2001 |
| JP | 2003-115568 | 4/2003 |
| JP | 2006-195177 | 7/2006 |
| KR | 2001-0007075 | 1/2001 |
| KR | 2003-0011647 | 2/2003 |

* cited by examiner

HEAT DISSIPATING STRUCTURE OF INTEGRATED CIRCUIT CHIP OF PLASMA DISPLAY MODULE AND PLASMA DISPLAY MODULE INCLUDING THE SAME

CROSS-REFERENCE TO RELATED PATENT APPLICATION

This application claims the benefit of Korean Patent Application No. 10-2005-0052018, filed on Jun. 16, 2005, in the Korean Intellectual Property Office, the disclosure of which is incorporated herein in its entirety by reference.

BACKGROUND OF THE INVENTION

1. Field of the Invention

The present invention relates to a heat dissipating structure of an integrated circuit chip of a plasma display module, and more particularly, to a heat dissipating structure of an integrated circuit chip of a plasma display module and a plasma display module including the same, which can improve heat dissipating performance of the integrated circuit chip.

2. Description of the Related Technology

Recently, a conventional cathode-ray tube display device has been substituted with a plasma display apparatus. In the plasma display apparatus, discharge gas is filled between two substrates on which a plurality of electrodes are formed and a discharge voltage is applied to the electrodes to generate ultraviolet radiation. The ultraviolet radiation excites a phosphor formed in a predetermined pattern to emit visible light, thereby forming a desired image.

The plasma display apparatus includes a plasma display module, which generally includes a plasma display panel and a driving device for driving the plasma display panel.

The driving device includes circuit elements and a circuit board on which the circuit elements are mounted. The circuit board is electrically connected to the plasma display panel through a signal transmitting member.

In the signal transmitting member, a plurality of interconnections extend in a lengthwise direction of the signal transmitting member, and at least a portion of the interconnections is connected to an integrated circuit chip.

When the plasma display panel is driven, a large amount of heat is generated from the integrated circuit chip. However, a conventional heat dissipating structure of the integrated circuit chip can not efficiently dissipate the heat generated from the integrated circuit chip and thus performance and life span of the integrated circuit chip are deteriorated.

SUMMARY OF CERTAIN INVENTIVE ASPECTS

One aspect of the present invention provides a heat dissipating structure of an integrated circuit chip of a plasma display module and a plasma display module including the same, which can improve heat dissipate performance by forming a protruding portion in a chassis bending portion or a reinforcement member.

Another aspect of the present invention provides a heat dissipating structure of an integrated circuit chip of a plasma display module, including: a chassis including a chassis base and a chassis bending portion in which at least one protruding portion is formed and the integrated circuit chip which is mounted on the cassis bending portion and connected to a signal transmitting member.

In an exemplary embodiment, the chassis bending portion may be formed in an edge portion of the chassis.

In an exemplary embodiment, the chassis bending portion may include a first bending portion and a second bending portion which is bent and extends to the first bending portion.

In an exemplary embodiment, the protruding portion may be formed in the first bending portion.

In an exemplary embodiment, the protruding portion may be formed by curving a portion of the first bending portion, and an air vent hole may be formed in the side of the protruding portion.

In an exemplary embodiment, the protruding portion may be protruded toward a center portion of the chassis base.

In an exemplary embodiment, the protruding portion may be protruded toward an edge of the second bending portion.

In an exemplary embodiment, the integrated circuit chip may be mounted on the second bending portion.

In an exemplary embodiment, the signal transmitting member may be a tape carrier package.

In an exemplary embodiment, a thermal grease may be interposed between the chassis bending portion and the integrated circuit chip.

In an exemplary embodiment, a cover plate may be mounted on the chassis bending portion so as to face the integrated circuit chip.

In an exemplary embodiment, a chip heat-dissipating sheet may be interposed between the integrated circuit chip and the cover plate.

In an exemplary embodiment, a plasma display module may include the aforementioned heat dissipating structure.

Another aspect of the present invention provides a heat dissipating structure of an integrated circuit chip of a plasma display module, including: a chassis including a chassis base and a reinforcement member in which at least one protruding portion is formed and the integrated circuit chip which is mounted on the reinforcement member and connected to a signal transmitting member.

In an exemplary embodiment, the reinforcement member may be formed in an edge portion of the chassis.

In an exemplary embodiment, the reinforcement member may include a mounting portion, a first bending portion which is bent and extends to the mounting portion, and a second bending portion which is bent and extends to the first bending portion.

In an exemplary embodiment, the protruding portion may be formed in the first bending portion.

In an exemplary embodiment, the protruding portion may be formed by curving a portion of the first bending portion, and an air vent hole may be formed in the side of the protruding portion.

In an exemplary embodiment, the protruding portion may be protruded toward a center portion of the chassis base.

In an exemplary embodiment, the protruding portion may be protruded toward an edge of the second bending portion.

In an exemplary embodiment, the integrated circuit chip may be mounted on the second bending portion.

In an exemplary embodiment, the signal transmitting member may be a tape carrier package.

In an exemplary embodiment, a thermal grease may be interposed between the reinforcement member and the integrated circuit chip.

In an exemplary embodiment, a cover plate may be mounted on the reinforcement member so as to face the integrated circuit chip.

In an exemplary embodiment, a chip heat-dissipating sheet may be interposed between the integrated circuit chip and the cover plate.

In an exemplary embodiment, a plasma display module may include the aforementioned heat dissipating structure.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1:
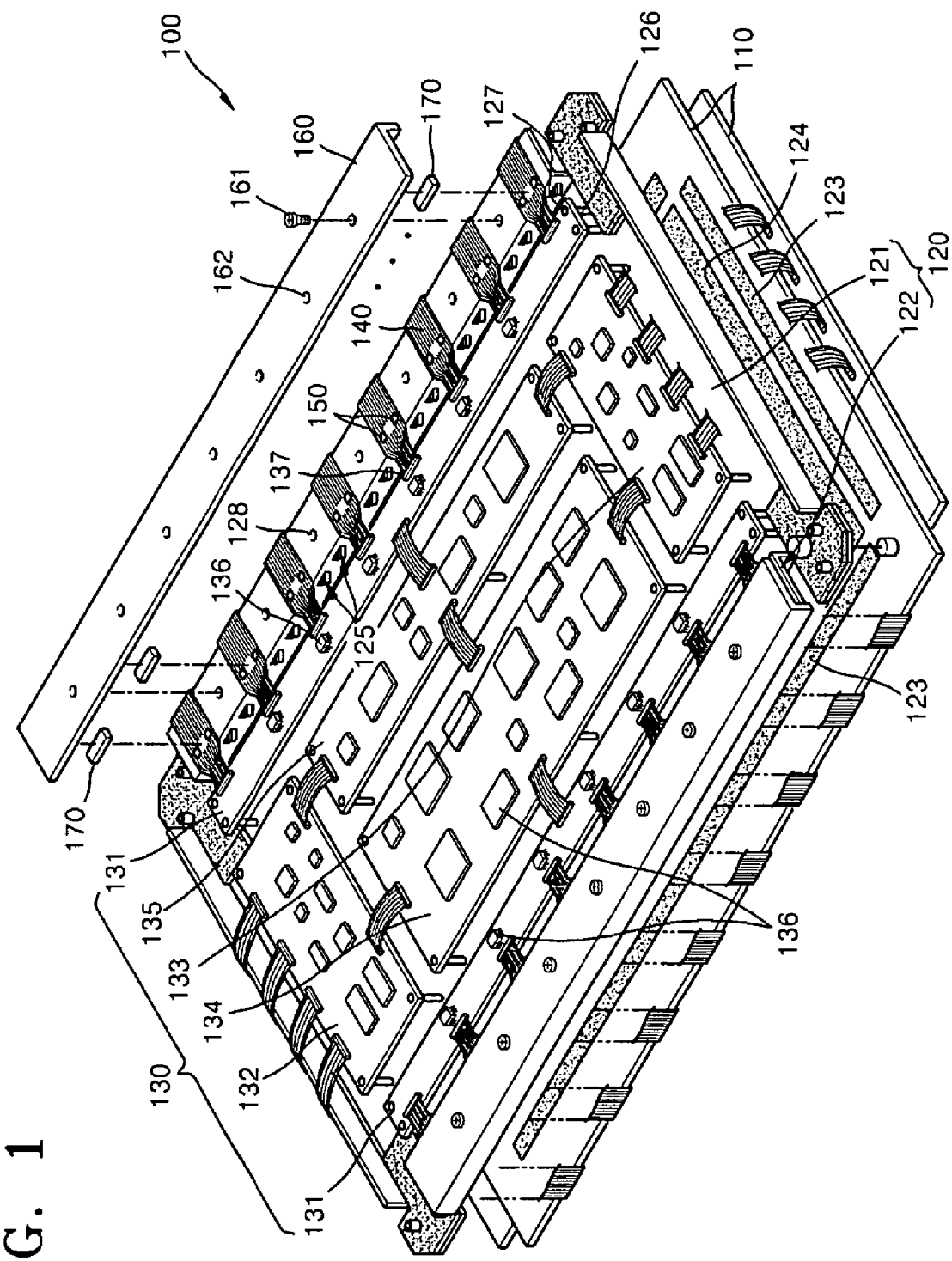
FIG. 1 is a schematic exploded perspective view of a plasma display module including a heat dissipating structure of an integrated circuit chip according to a first embodiment of the present invention.
Figure 2:
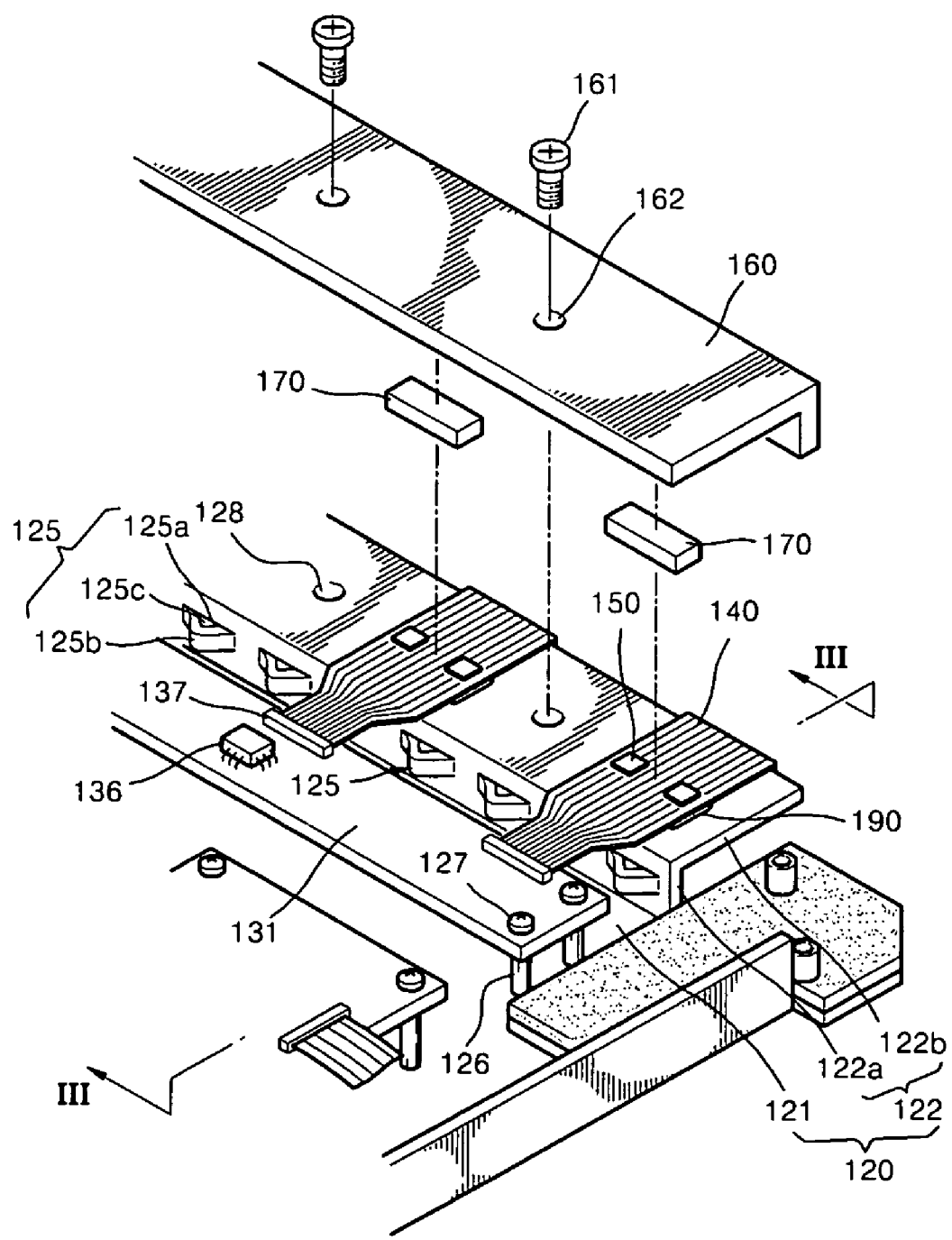
FIG. 2 is an enlarged exploded perspective view of enlarging a chassis bending portion of FIG. 1.
Figure 3:
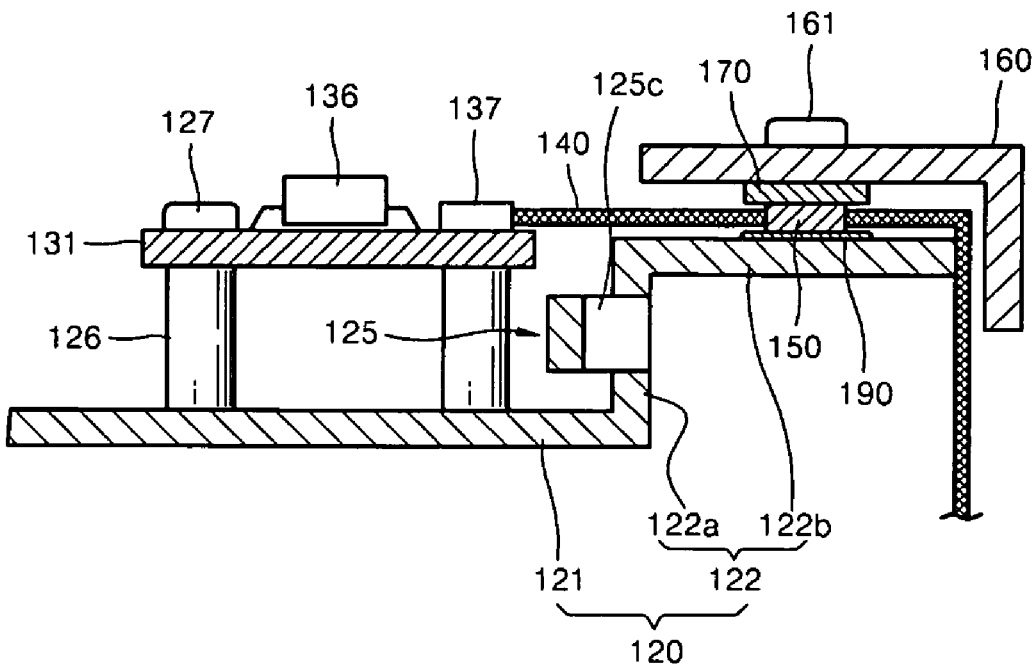
FIG. 3 is a schematic enlarged cross-sectional view taken along line III-III shown in FIG. 2.

FIG. 1 is a schematic exploded perspective view of a plasma display module including a heat dissipating structure of an integrated circuit chip according to a first embodiment of the present invention, and FIG. 2 is an enlarged exploded perspective view of a chassis bending portion of FIG. 1, FIG. 3 is a schematic enlarged cross-sectional view taken along line III-III shown in FIG. 2.

In one embodiment, the plasma display module 100 includes a plasma display panel 110, a chassis 120, a circuit board 130, a signal transmitting member 140, an integrated circuit board 150, and a cover plate 160.

The plasma display panel 110 is mounted on a front surface of the chassis 120. In one embodiment, the plasma display panel 110 is coupled to the chassis 120 through, for example, a double sided adhesive means 123 attached to a rear surface of the plasma display panel 110. In one embodiment, the double sided adhesive means 123 includes a double sided tape.

In one embodiment, a panel heat-dissipating sheet 124 having a superior thermal conductivity is interposed between the plasma display panel 110 and the chassis 120 and transfers heat generated when driving the plasma display panel 110 to the chassis 120.

In one embodiment, the chassis 120 is made of aluminum and includes a chassis base 121 and a chassis bending portion 122.

The chassis base 121 is generally located in a center portion of the chassis 120 and has a boss 126 which is pressed and formed therein.

In one embodiment, the chassis bending portion 122 is located in an edge portion of the chassis 120, and is bent and extends at a height similar to that of the circuit board 130.

In one embodiment, the chassis bending portion 122 includes a first bending portion 122a which contacts the chassis base 121 and a second bending portion 122b which is bent and extends to the first bending portion 122a.

Although, in the first embodiment, the chassis bending portion 122 includes only the first bending portion 122a and the second bending portion 122b, the present invention is not limited to this. That is, as long as the integrated circuit chip and the signal transmitting member can be mounted on the chassis bending portion 122, the chassis bending portion 122 may be formed in various shapes. For example, the chassis bending portion 122 of the first embodiment may further include a third bending portion which is bent and extends to the second bending portion toward the plasma display panel 110.

A plurality of protruding portions 125 are formed in the first bending portion 122a.

In one embodiment, the protruding potions 125 are formed by curving portions of the first bending portion 122a. In another embodiment, the protruding portions 125 may be integrally formed on the first bending portion 122a. In this embodiment, a through hole may be or may not be defined in the protruding potions 125. This can be applied to other embodiments. The process of forming the protruding portions 125 will now be described with reference to FIGS. 4 and 5.

Figure 4:
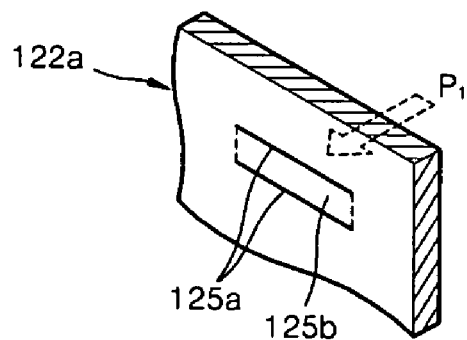
FIG. 4 is a schematic perspective view illustrating a state of forming a cutting portion according to the first embodiment of the present invention.
Figure 5:
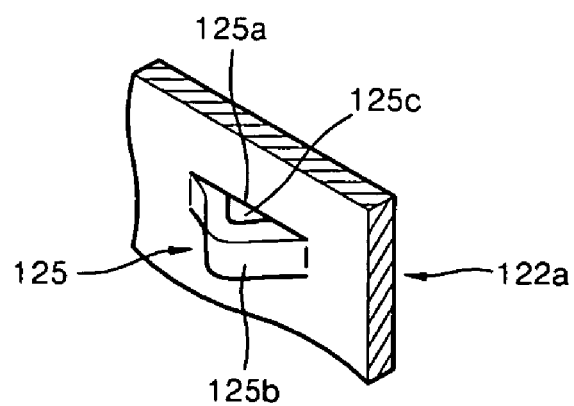
FIG. 5 is a schematic perspective view illustrating a state of forming a protruding portion according to the first embodiment of the present invention.

FIG. 4 is a schematic perspective view illustrating a state of forming a cutting portion according to the first embodiment of the present invention, and FIG. 5 is a schematic perspective view illustrating a state of forming the protruding portion according to the first embodiment of the present invention.

First, referring to FIG. 4, a portion of the first bending portion 122a in which the protruding portion 125 will be formed is determined and then the both ends of the portion 125 are cut to form two cutting portions 125a.

Next, a load $P_1$ is applied to a portion 125b between the cutting portions 125a in an arrow direction. Thus, the portion 125b between the cutting portions 125a is protruded and expanded in a direction opposite to the load $P_1$ to generate plastic deformation, thereby forming the protruding portion 125, as shown in FIG. 5.

At this time, the load $P_1$ is suitably determined in consideration of a thickness, a material, and modulus of elasticity of the first bending portion 122a. In one embodiment, the portion 125b is curved (protruded) so that an air vent hole 125c is sufficiently formed in the side of the protruding portion 125, and the protruding portion 125 is protruded toward the center portion of the chassis base 121.

The air vent hole 125c formed in the side of the protruding portion 125 causes air in a lower end of the second bending portion 122b and air in the circuit board 130 to be communicated with each other to improve heat dissipating performance of the integrated circuit chip 150.

In another embodiment, the protruding portion and the air vent hole may be formed by cutting only one end of the portion in which the protruding portion will be formed to form the cutting portion and applying the load to the cutting portion.

Furthermore, although, in the first embodiment, the protruding portion 125 is protruded toward the center portion of the chassis base 121, the present invention is not limited to this. That is, the protruding portion 125 may be protruded toward an edge of the second bending portion 122b.

Also, although, in the first embodiment, the two cutting portions 125a are parallel to a boundary between the first bending portion 122a and the second bending portion 122b, the present invention is not limited to this. That is, the cutting portions 125a may be perpendicular to the boundary between the first bending portion 122a and the second bending portion 122b may be inclined at any angle.

Further, although, in the first embodiment, the air vent hole 125c has a bell-shaped cross section, the present invention is not limited to this. That is, the shape of the air vent hole 125c may vary according to a shape of a device for applying the load, such as dies.

On the other hand, an installation hole 128 in which a female screw is formed in an inner circumferential surface thereof is formed in the second bending portion 122b and the cover plate 160 is fixed to the second bending portion 122b.

A signal transmitting member 140, the integrated circuit chip 150, and the cover plate 160 are disposed on the second bending portion 122b.

The circuit board 130 includes an address electrode buffer circuit board 131, an X-electrode driving circuit board 132, a Y-electrode driving circuit board 133, a power supply substrate 134, and a logic control board 135, and a plurality of circuit elements 136 are arranged thereon.

The circuit board 130 is mounted on the chassis base 121 by bosses 126 and bolts 127.

A connector 137 for electrical connection with the signal transmitting member 140 is disposed on the circuit board 130.

In one embodiment, the signal transmitting member 140 for transmitting an address signal crosses over the second bending portion 122b of the chassis bending portion 122. One end of the signal transmitting member 140 may be connected to the connector 137 mounted on the address electrode buffer circuit board 131, and the other end thereof may be connected to the plasma display panel 110 through the second bending portion 122b.

In one embodiment, the signal transmitting member 140 for electrically connecting the plasma display panel 110 with the address electrode buffer circuit board 131 uses a connecting line called as a tape carrier package (TCP).

In one embodiment, the integrated circuit chip 150 is mounted on the second bending portion 122b and connected to the signal transmitting member 140 to control an electrical signal.

In one embodiment, a thermal grease 190 is interposed between the integrated circuit chip 150 and the second bending portion 122b.

In another embodiment, the integrated circuit chip may directly contact the chassis bending portion 122 without sandwiching the thermal grease therebetween.

In one embodiment, the cover plate 160 is mounted on the second bending portion 122b to protect the signal transmitting member 140 and the integrated circuit chip 150 and to dissipate the heat generated from the integrated circuit chip 150.

In one embodiment, a mounting hole 162 is formed in the cover plate 160.

In one embodiment, a chip heat-dissipating sheet 170 is interposed between the integrated circuit chip 150 and the cover plate 160. The chip heat-dissipating sheet 170 transfers the heat generated from the integrated circuit chip 150 to the cover plate 160.

In one embodiment, the chip heat-dissipating sheet 170 is made of a material having a superior thermal conductivity, and one surface thereof is an adhesive surface.

In one embodiment, the heat dissipating structure of the integrated circuit chip can be mounted by way of the following method.

First, the protruding portion 125 is formed in the first bending portion 122a of the chassis bending portion 122. In this case, for example, the protruding portion 125 is formed after the chassis bending portion 122 is formed. Alternatively, for convenience's sake, after the protruding portion 125 is formed, the chassis bending portion 122 may be formed by bending the chassis.

Next, the signal transmitting member 140 and the integrated circuit chip 150 are mounted on the second bending portion 122b of the chassis bending portion 122.

Subsequently, the chip heat-dissipating sheet 170 is positioned between the integrated circuit chip 150 and the cover plate 160. Thereafter, a mounting bolt 161 is inserted through a mounting hole 162 to couple the mounting bolt 161 to the female screw of the installation hole 128 so that the cover plate 160 is mounted on the second bending portion 122b of the chassis bending portion 122.

Hereinafter, an operation of the plasma display module 100 including the heat dissipating structure of the integrated circuit chip according to the first embodiment and a path of transferring the heat generated from the integrated circuit chip 150 will be described.

When a user operates the plasma display module 100, the circuit board 130 is driven and a voltage is applied to the plasma display panel 110.

When the voltage is applied to the plasma display panel 110, address discharge and sustain discharge are generated so that an energy level of discharge gas excited by the sustain discharge is lowered and thus ultraviolet radiation is emitted. The ultraviolet radiation excites a phosphor of a phosphor layer coated in discharge cells so that an energy level of the excited phosphor is lowered and thus visible rays are emitted, thereby forming an image which can be recognized by the user.

At this time, a large amount of the heat is generated from the integrated circuit board 150 mounted on the second bending portion 122b of the chassis bending portion 122. A portion of the generated heat is transferred to the cover plate 160 through the chip heat-dissipating sheet 170 and the other thereof is transferred to the second bending portion 122b through the thermal grease 190.

The heat which is transferred from the integrated circuit chip 150 to the cover plate 160 is directly dissipated by convectively transferring the heat to air contacting the cover plate 160.

Furthermore, a portion of the heat which is transferred from the integrated circuit chip 150 to the second bending portion 122b is transferred to the chassis base 121 through the first bending portion 122a, and the other thereof is directly dissipated by convectively transferring the heat to the air contacting the surfaces of the second bending portion 122b and the first bending portion 122a.

The air which receives the heat from the surfaces of the second bending portion 122b and the first bending portion 122a flows to continuously transfer the heat to air having a low temperature. In one embodiment, the protruding portion 125 formed in the first bending portion 122a functions as a fin to smoothly transfer the heat so that air having a low temperature and air having a high temperature are communicated with each other through the air vent hole 125c formed in the side of the protruding portion 125. Thus, the convective heat transfer can be more efficiently performed.

Accordingly, in the plasma display module 100 including the heat dissipating structure of the integrated circuit chip according to the first embodiment, the plurality of the protruding portions 125 are mounted in the first bending portion 122a of the chassis bending portion 122. Thus, the heat transfer efficiency of the air which is a convective heat transfer medium can increase, and the heat dissipating performance of the integrated circuit chip 150 can be improved by good air flow.

Hereinafter, a modified example of the first embodiment of the present invention will be described with reference to FIG. 6. Particularly, a portion which is different from that of the first embodiment will be described in detail.

Figure 6:
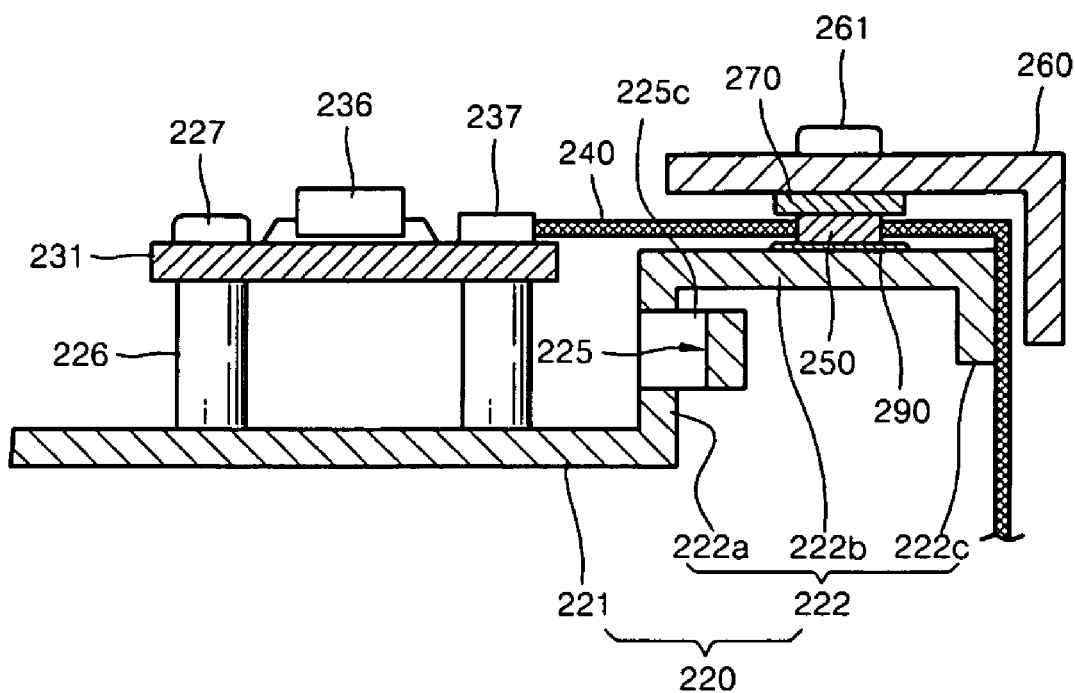
FIG. 6 is a schematic enlarged cross-sectional view of the chassis bending portion according to a modified example of the first embodiment of the present invention.

FIG. 6 is a schematic enlarged cross-sectional view of the chassis bending portion according to a modified example of the first embodiment of the present invention.

In one embodiment, the heat dissipating structure of the integrated circuit chip of the plasma display module includes a chassis 220, and an address electrode buffer circuit board 231, a signal transmitting member 240, an integrated circuit board 250, and a cover plate 260.

The chassis 220 includes a chassis base 221 and a chassis bending portion 222. The chassis bending portion 222 includes a first bending portion 222a, a second bending portion 222b, and a third bending portion 222c.

In one embodiment, the address electrode buffer circuit board 231 on which a circuit element 236 is mounted is fixed to the chassis base 220 by a boss 226 and a bolt 227, and includes a connector 237 to be electrically connected to the plasma display panel by the signal transmitting member 240.

In one embodiment, the cover plate 260 is fixed to the second bending portion 222b by, for example, a mounting bolt 261, and a panel heat-dissipating sheet 270, an integrated circuit chip 250, and a thermal grease 290 are sequentially interposed between the second bending portion 222b and the cover plate 260.

In one embodiment, a plurality of protruding portions 225 including an air vent hole 225c are formed in the first bending portion 222a, and each protruding portion 225 is protruded toward the third bending portion 222c. The structure of the protruding portion 225 and the method of forming the same are similar to those of the first embodiment and thus their description will be omitted.

According to one embodiment, the plurality of protruding portions 225 are formed in the first bending portion 222a of the chassis bending portion 222 to be protruded toward the third bending portion 222c. Thus, the heat dissipating efficiency of the air which is the convective heat transfer medium can increase and the heat dissipating performance of the integrated circuit chip 250 can be improved by good air flow. Also, the address electrode buffer circuit board 231 can be formed to be more close to the chassis bending portion 222 and thus a space can be efficiently used.

The other structure, operation, and effect of the present modified example are similar to those of the heat dissipating structure of the integrated circuit chip of the plasma display module according to the first embodiment, and thus their description will be omitted.

Hereinafter, another modified example of the first embodiment of the present invention will be described with reference to FIGS. 7, 8, and 9. Particularly, a portion which is different from that of the first embodiment will be described in detail.

Figure 7:
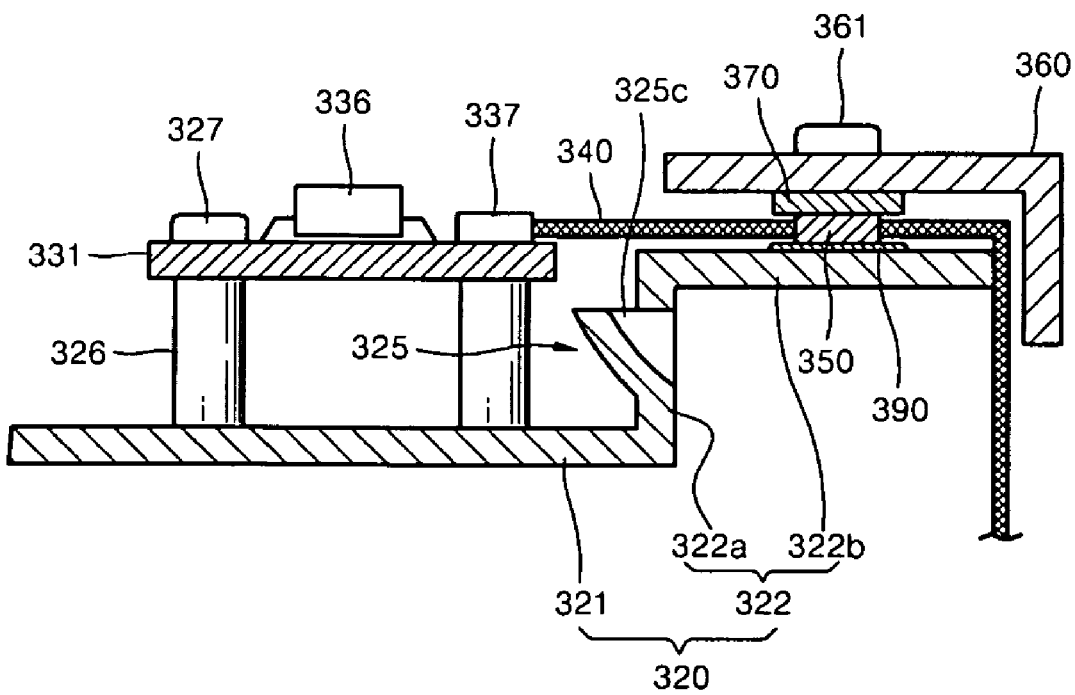
FIG. 7 is a schematic enlarged cross-sectional view of the chassis bending portion according to another modified example of the first embodiment of the present invention.

FIG. 7 is a schematic enlarged cross-sectional view of the chassis bending portion according to another modified example of the first embodiment of the present invention.

In one embodiment, the heat dissipating structure of the integrated circuit chip of the plasma display module includes a chassis 320, and an address electrode buffer circuit board 331, a signal transmitting member 340, an integrated circuit board 350, and a cover plate 360.

Similar to the first embodiment, the chassis 320 includes a chassis base 321 and a chassis bending portion 322. The chassis bending portion 322 includes a first bending portion 322a and a second bending portion 322b.

In one embodiment, the address electrode buffer circuit board 331 on which a circuit element 336 is mounted is fixed to the chassis base 320 by a boss 326 and a bolt 327, and includes a connector 337 to be electrically connected to the plasma display panel by the signal transmitting member 340.

In one embodiment, the cover plate 360 is fixed to the second bending portion 322b by, for example, a mounting bolt 361, and a panel heat-dissipating sheet 370, an integrated circuit chip 350, and a thermal grease 390 are sequentially interposed between the second bending portion 322b and the cover plate 360.

In one embodiment, a plurality of protruding portions 325 are formed in the first bending portion 322a.

In one embodiment, the protruding portions 325 are formed by curving portions of the bending portion 322a, and the forming process thereof will now be described with reference to FIGS. 8 and 9.

Figure 8:
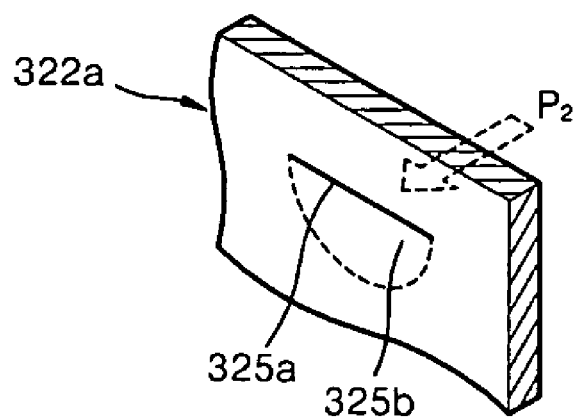
FIG. 8 is a schematic perspective view illustrating a state of forming a cutting portion according to another modified example of the first embodiment of the present invention.
Figure 9:
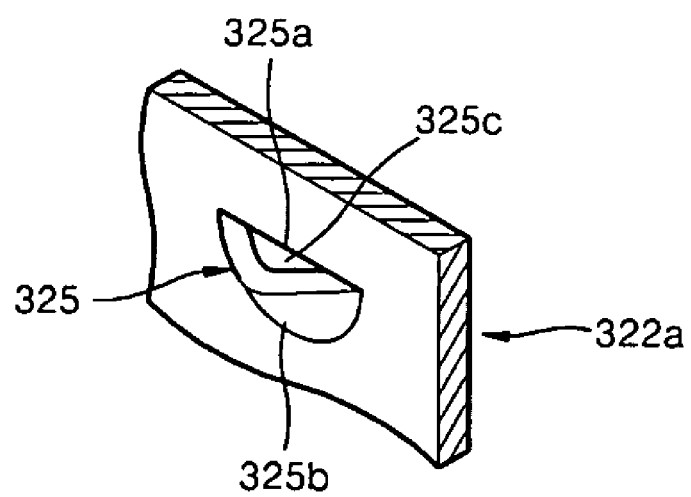
FIG. 9 is a schematic perspective view illustrating a state of forming a protruding portion according to another modified example of the first embodiment of the present invention.

FIG. 8 is a schematic perspective view illustrating a state of forming a cutting portion according to the present modified example, and FIG. 9 is a schematic perspective view illustrating a state of forming a protruding portion according to the present modified example.

First, referring to FIG. 8, a portion of the first bending portion 322a in which the protruding portion 325 will be formed are determined and a cutting portion 325a is formed in one end of the portion.

In one embodiment, a load $P_2$ is applied to a portion 325b below the cutting portion 325a in an arrow direction. Thus, the portion 325b below the cutting portion 325a is curved and expanded in a direction opposite to the load $P_2$ to generate plastic deformation, thereby forming the curving portion 325, as shown in FIG. 9.

In one embodiment, the load $P_2$ is suitably determined in consideration of a thickness, a material, modulus of elasticity of the first bending portion 322a. In one embodiment, the portion 325b is curved so that an air vent hole 325c is sufficiently formed in the side of the protruding portion 325, and the protruding portion 325 is protruded toward a center portion of the chassis base 321.

The air vent hole 325c formed in the side of the protruding portion 325 causes air in a lower end of the second bending portion 322b and air in the circuit board 330 to be communicated with each other to improve the heat dissipating performance of the integrated circuit chip 350.

Although, in the present modified example, the portion 325b below the cutting portion 325a is curved, the present invention is not limited to this. That is, a portion above the cutting portion 325a may be curved.

As described above, according to the present modified example, since the protruding portion 325 has only one cutting portion 325a unlike the first embodiment, a process time can be reduced and the protruding portion can be more easily formed.

The other structure of the protruding portion 325 and the method of forming the same are similar to those of the protruding portion 125 of the first embodiment, and thus their description will be described.

According to the present modified example, the plurality of protruding portions 325 are formed in the first bending portion 322a of the chassis bending portion 322 and one cutting portion 325 per the protruding portion 325 is formed. Thus, the heat transfer efficiency of the air which is the convective heat transfer medium can increase and the heat dissipating performance of the integrated circuit chip 350 can be improved by good air flow. Also, the process time for forming the protruding portion 325 can be reduced.

The other structure, operation, and effect of the present modified example are similar to those of the heat dissipating structure of the integrated circuit chip of the plasma display module according to the first embodiment, and thus their description will be omitted.

Hereinafter, a second embodiment of the present invention will be described with reference to FIGS. 10 through 12.

Figure 10:
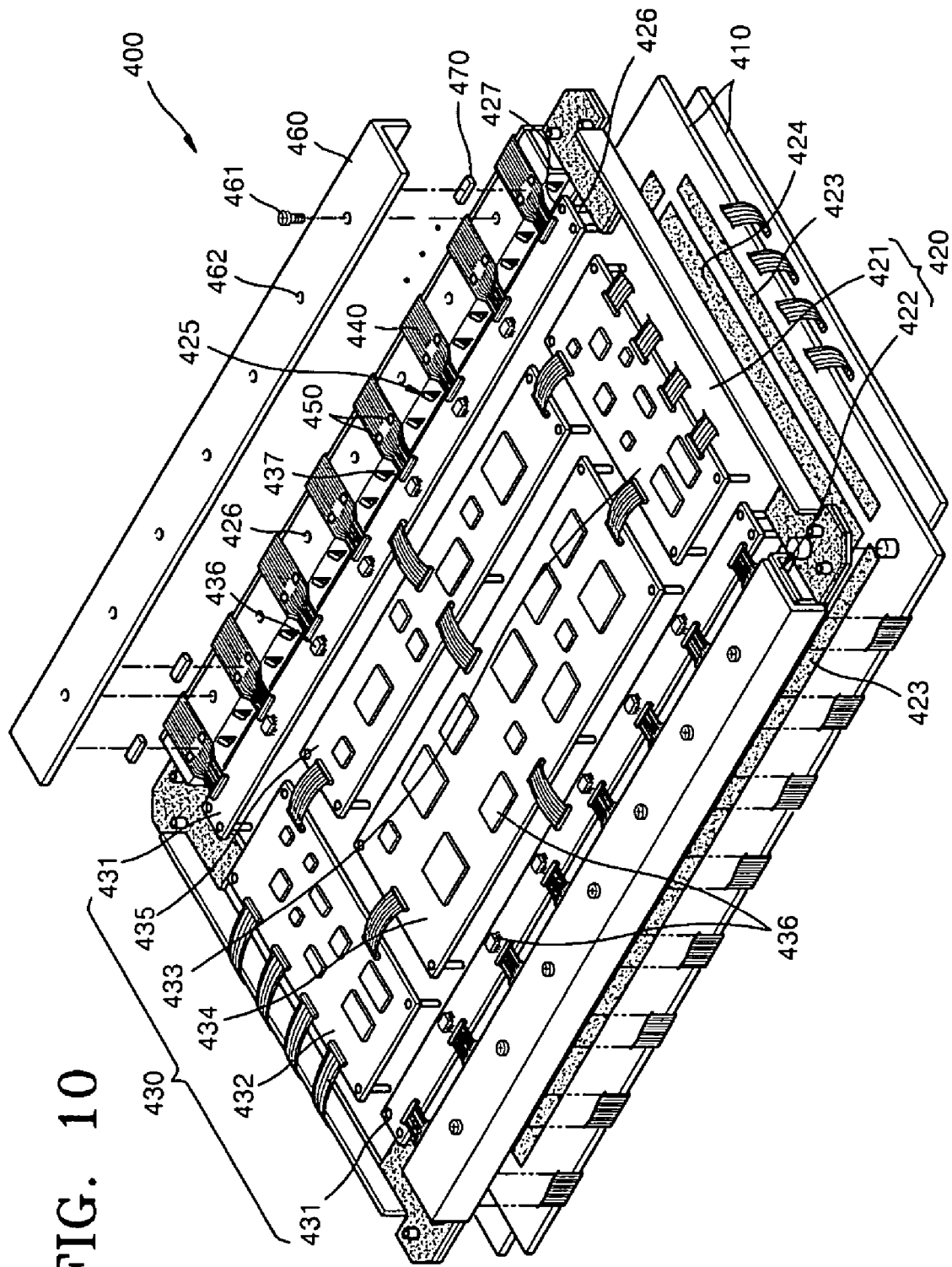
FIG. 10 is a schematic exploded perspective view of a plasma display module including a heat dissipating structure of an integrated circuit chip according to a second embodiment of the present invention.
Figure 11:
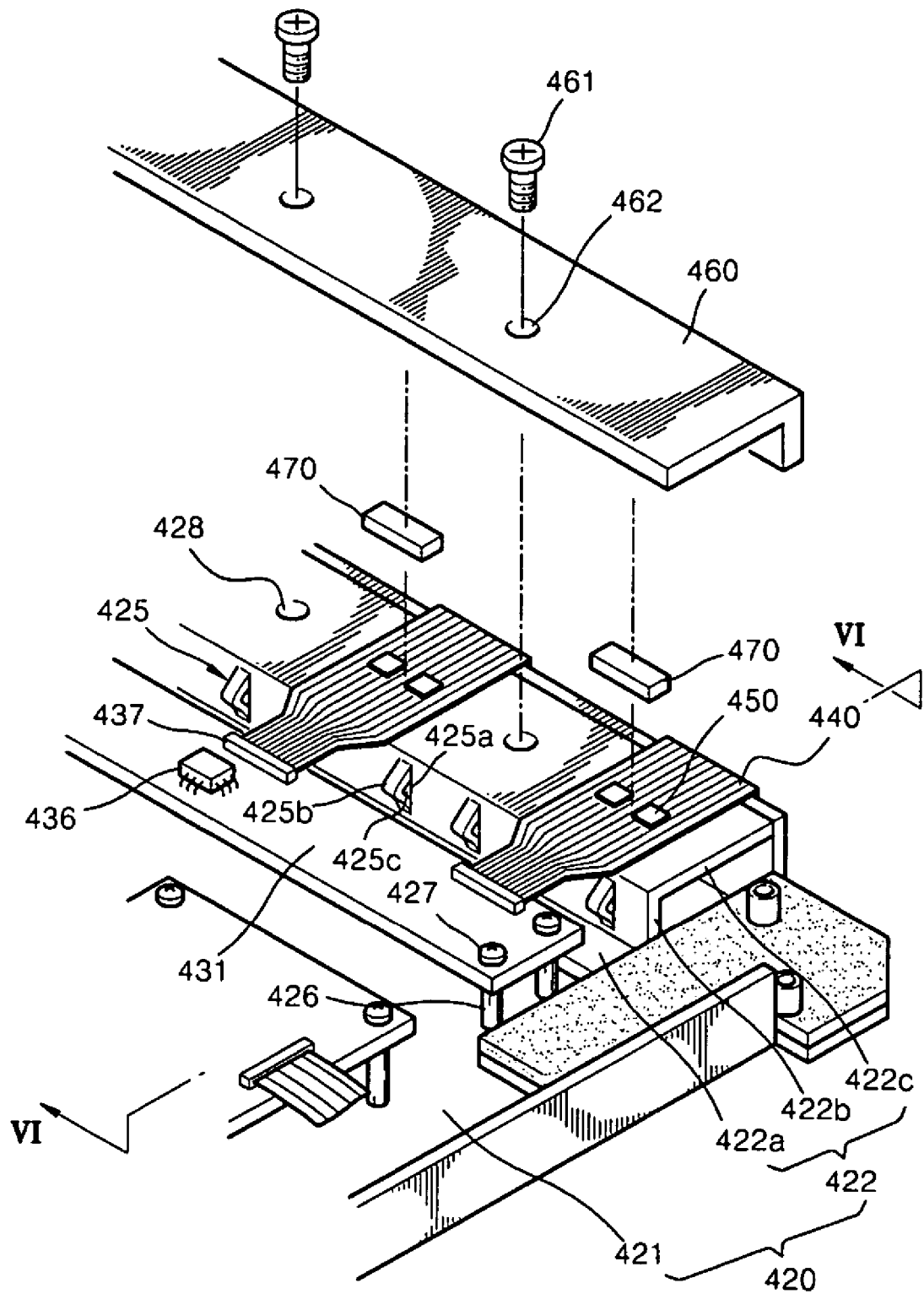
FIG. 11 is an enlarged exploded perspective view of a reinforcement member shown in FIG. 10.
Figure 12:
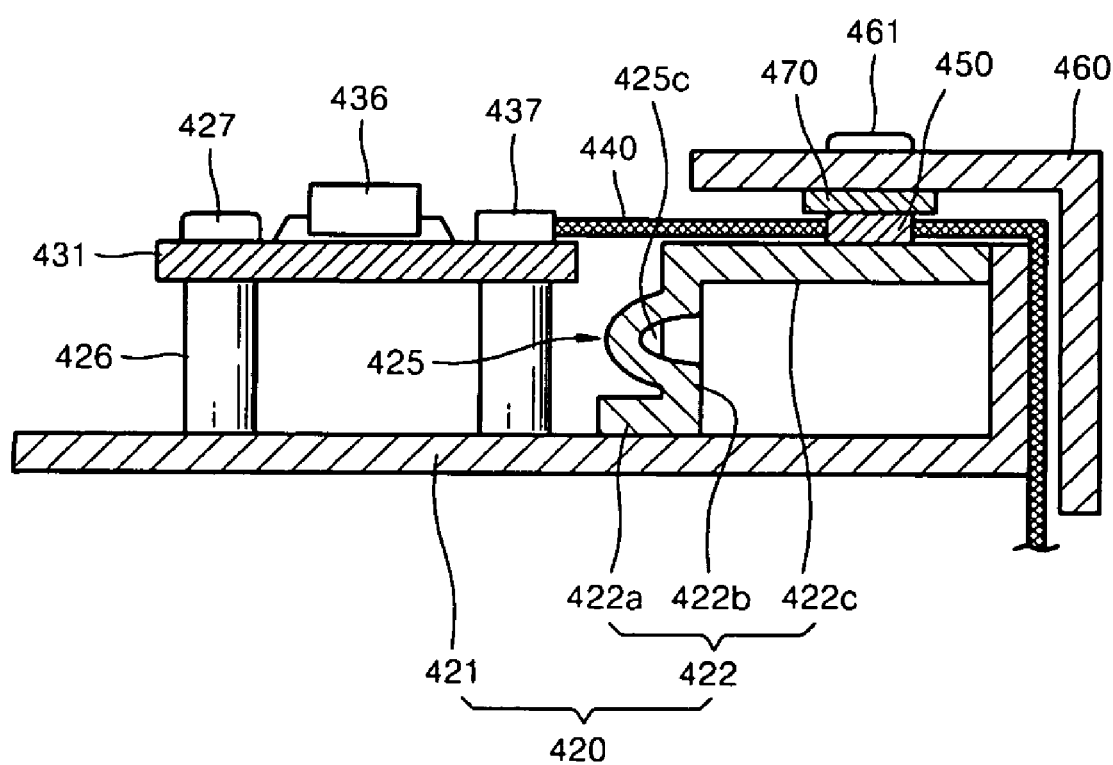
FIG. 12 is a schematic enlarged cross-sectional view taken along line VI-VI shown in FIG. 11.

FIG. 10 is a schematic exploded perspective view of a plasma display module including a heat dissipating structure of an integrated circuit chip according to the second embodiment of the present invention, and FIG. 11 is an enlarged exploded perspective view of a reinforcement member shown in FIG. 10, and FIG. 12 is a schematic enlarged cross-sectional view taken along line VI-VI shown in FIG. 11.

In one embodiment, the plasma display panel 400 includes a plasma display panel 410, a chassis 420, a circuit board 430, a signal transmitting member 440, an integrated circuit chip 450, and a cover plate 460.

The plasma display panel 410 is mounted on a front surface of the chassis 420. In one embodiment, the plasma display panel 410 is coupled to the chassis 420 through a double sided adhesive means 423 attached to a rear surface of the plasma display panel 410. In one embodiment, the double sided adhesive means 423 includes a double sided tape.

In one embodiment, a panel heat-dissipating sheet 424 having a superior thermal conductivity is interposed between the plasma display panel 410 and the chassis 420 and transfers heat generated when driving the plasma display panel 410 to the chassis 420.

In one embodiment, the chassis 420 is made of aluminum and includes a chassis base 421 and a reinforcement member 422.

In one embodiment, the chassis base 421 is located in a center portion of the chassis 420 and has a boss 426 which is pressed and formed therein.

In one embodiment, the reinforcement member 422 is located in edge portions of the chassis, and is mounted on the chassis base 421 at a height similar to that of the circuit board 430.

In one embodiment, the reinforcement member 422 includes a mounting portion 422a, a first bending portion 422b, and a second bending portion 422c.

In one embodiment, the mounting portion 422a is directly attached to the chassis base 421 to mount the reinforcement member 422 on the chassis base 421.

The first bending portion 422b is bent and extends to the mounting portion 422a.

The second bending portion 422c is bent and extends to the first bending portion 422b, and the integrated circuit chip 450 and the cover plate 460 are mounted on the second bending portion 422c.

Although, in the second embodiment, the reinforcement member 422 includes only the mounting portion 421a, the first bending portion 422b, and the second bending portion 422c, the present invention is not limited to this. That is, as long as the integrated circuit chip 450 and the signal transmitting member 440 are disposed on the reinforcement member 422, the reinforcement member 422 may be formed in various shapes.

In one embodiment, a plurality of protruding portions 425 are formed in the first bending portion 422b.

In one embodiment, the protruding potions 425 are formed by curving portions of the first bending portion 422b. The process of forming the protruding portions 425 are performed using the same method as the process of forming the protruding portion 125 of the first embodiment.

However, unlike the first embodiment, a direction of a cutting portion 425a formed by determining a portion of the first bending portion 422b in which the protruding portion 425 will be formed and cutting a predetermined portion thereof is perpendicular to a boundary between the first bending portion 422b and the second bending portion 422c.

An air vent hole 425c formed in the side of the protruding portion 425 causes air in a lower end of the second bending portion 422c and air in the circuit board 430 to be communicated with each other to improve the heat dissipating performance of the integrated circuit chip 450.

In one embodiment, an installation hole 428 in which a female screw is formed in an inner circumferential surface thereof is formed in the second bending portion 422c and the cover plate 460 is fixed to the second bending portion 422c.

The signal transmitting member 440, the integrated circuit chip 450, and the cover plate 460 are mounted on the second bending portion 422c.

The circuit board 430 generally includes an address electrode buffer circuit board 431, an X-electrode driving circuit board 432, a Y-electrode driving circuit board 433, a power supply board 434, and a logic control board 435, and a plurality of circuit elements 436 are arranged thereon.

In one embodiment, the circuit board 430 is mounted on the chassis base 421 by a boss 426 and a bolt 427, and includes a connector 437 to be electrically connected to the signal transmitting member 440.

In one embodiment, the signal transmitting member 440 for transmitting an address signal crosses over the second bending portion 422c of the reinforcement member 422. In one embodiment, one end of the signal transmitting member 440 is connected to the connector 437 mounted on the address electrode buffer circuit board 431, and the other end thereof is connected to the plasma display panel 410 through the reinforcement member 422.

In one embodiment, the signal transmitting member 440 for electrically connecting the plasma display panel 410 with the address electrode buffer circuit board 431 uses a connecting line called as a tape carrier package (TCP), similar to the first embodiment.

In one embodiment, the integrated circuit chip 450 is mounted above the second bending portion 422c of the reinforcement member 422, and connected with the signal transmitting member 440 to control an electrical signal.

In one embodiment, the cover plate 460 is mounted on the second bending portion 422c of the reinforcement member 422 to protect the signal transmitting member 440 and the integrated circuit chip 450 to dissipate the heat generated from the integrated circuit chip 450.

In one embodiment, a mounting hole 462 is formed in the cover plate 460.

In one embodiment, a chip heat-dissipating sheet 470 having a superior thermal conductivity is interposed between the integrated circuit chip 450 and the cover plate 460. The chip heat-dissipating sheet 470 transfers the heat generated from the integrated circuit chip 450 to the cover plate 460.

In one embodiment, the heat dissipating structure of the integrated circuit chip can be mounted by way of the following method.

First, the protruding portion 425 is formed in the first bending portion 422b of the reinforcement member 422. In this case, for example, the protruding portion 425 is formed after the reinforcement member 422 is formed. Alternatively, for convenience's sake, after the protruding portion 425 is formed, the reinforcement member 422 may be formed by bending a board.

Next, the reinforcement member 422 is formed on the chassis base 421 by, for example, welding, soldering, or TOX® of non-penetration and non-rivet.

Next, the signal transmitting member 440 and the integrated circuit chip 450 are mounted on the second bending portion 422c of the reinforcement member 422.

Subsequently, the chip heat-dissipating sheet 470 is positioned between the integrated circuit chip 450 and the cover plate 460 and penetrates a mounting bolt 461 through the mounting hole 462 to couple the mounting bolt 461 to the female screw of the installation hole 428 so that the cover plate 460 is mounted on the second bending portion 422c of the reinforcement member 422.

The operation of the plasma display module 400 including the heat dissipating structure of the integrated circuit chip according to the second embodiment is similar to that of the first embodiment, and thus their description will be omitted.

Hereinafter, a path of dissipating the heat generated from the integrated circuit chip 450 of the heat dissipating structure of the integrated circuit chip according to the second embodiment will be described.

When the plasma display module 410 is driven, a large amount of heat is generated from the integrated circuit chip 450 mounted on the reinforcement member 422. At this time, a portion of the heat is transferred to the cover plate 460 through the chip heat-dissipating sheet 470, and the other thereof is transferred to the second bending portion 422c of the reinforcement member 422.

The heat which is transferred from the integrated circuit chip 450 to the cover plate 460 is directly dissipated by convectively transferring the heat to air contacting the cover plate 460.

Furthermore, a portion of the heat which is transferred from the integrated circuit chip 450 to the second bending portion 422c of the reinforcement member 422 is transferred to the chassis base 421 through the first bending portion 422b and the mounting portion 422a, and the other thereof is directly dissipated by convectively transferring the heat to the air contacting the surfaces of the second bending portion 422c and the first bending portion 422b.

The air which receives the heat from the surfaces of the second bending portion 422c and the first bending portion 422b flows to continuously transfer the heat to air having a low temperature. Here, the protruding portion 425 formed in the first bending portion 422b functions as a fin to smoothly transfer the heat so that air having a low temperature and air having a high temperature are communicated with each other through the air vent hole 425c formed in the side of the protruding portion 425. Thus, the convective heat transfer can be efficiently performed.

Accordingly, in the plasma display module 400 including the heat dissipating structure of the integrated circuit chip according to the second embodiment, the plurality of the protruding portions 425 are formed in the first bending portion 422b of the reinforcement member 422. Thus, the heat transfer efficiency of the air which is a convective heat transfer medium can increase and the heat dissipating performance of the integrated circuit chip 450 can be improved by good air flow.

As described above, according to embodiments of the present invention, since the protruding portion is formed in the chassis bending portion or the reinforcement member on which the integrated circuit chip is formed, the convective heat transfer efficiency can increase and the heat dissipating performance of the integrated circuit chip can be improved.

In addition, since the protruding portion which functions as a fin is formed in the chassis bending portion or the reinforcement member to transfer the heat to the air contacting the chassis bending portion or the reinforcement member, the convective heat transfer can be smoothly performed and the heat dissipating performance of the integrated circuit chip can be improved.

Furthermore, since the protruding portion includes the air vent hole in the side thereof so that the air having a high temperature or the air having a low temperature can freely flow through the air vent hole, the convective heat transfer can be smoothly performed and the heat dissipating performance of the integrated circuit chip can be improved.

Accordingly, according to embodiments of the present invention, the heat dissipating performance of the integrated circuit chip is improved and thus the performance and life span of the integrated circuit chip can increase. Also, the plasma display module can be stably driven.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A heat dissipating structure of an integrated circuit chip of a plasma display module, comprising:
   a chassis including a chassis base and a chassis bending portion in which at least one protruding portion is formed, wherein the chassis base comprises a surface from which the chassis bending portion extends;
   a circuit board formed on the surface of the chassis base; and
   the integrated circuit chip which is mounted on the chassis bending portion and connected to a signal transmitting member, wherein the chassis bending portion includes a first bending portion and a second bending portion which is bent and extends from the first bending portion, wherein the protruding portion is formed in the first bending portion, wherein the protruding portion is protruded in a direction substantially parallel with the surface of the chassis base, and wherein the protruding portion is formed between the circuit board and the integrated circuit chip.

2. The heat dissipating structure according to claim 1, wherein the chassis bending portion is formed in an edge portion of the chassis.

3. A heat dissipating structure of an integrated circuit chip of a plasma display module, comprising:
   a chassis including a chassis base and a chassis bending portion in which at least one protruding portion is formed; wherein the chassis base is substantially parallel with the plasma display module and the integrated circuit chip which is mounted on the chassis bending portion and connected to a signal transmitting member, wherein the chassis bending portion includes a first bending portion and a second bending portion which is bent and extends from the first bending portion, wherein the protruding portion is formed in the first bending portion, wherein the protruding portion is protruded toward a center portion of the chassis base, and wherein the protruding portion is formed by curving a portion of the first bending portion, and an air vent hole is formed in the side of the protruding portion and wherein the air vent hole is formed in a direction substantially perpendicular to the chase base.

4. A heat dissipating structure of an integrated circuit chip of a plasma display module, comprising:
   a chassis including a chassis base and a chassis bending portion in which at least one protruding portion is formed, wherein the chassis base comprises a surface from which the chassis bending portion extends;
   a circuit board formed on the surface of the chassis base; and
   the integrated circuit chip which is mounted on the chassis bending portion and connected to a signal transmitting member, wherein the chassis bending portion includes a first bending portion and a second bending portion which is bent and extends to the first bending portion, wherein the protruding portion is formed in the first bending portion, wherein the protruding portion is protruded in a direction substantially parallel with the surface of the chassis base, and wherein the protruding portion is formed between the circuit board and the integrated circuit chip.

5. The heat dissipating structure according to claim 1, wherein the integrated circuit chip is mounted on the second bending portion.

6. The heat dissipating structure according to claim 1, wherein the signal transmitting member is a tape carrier package.

7. The heat dissipating structure according to claim 1, further comprising a thermal grease interposed between the chassis bending portion and the integrated circuit chip.

8. The heat dissipating structure according to claim 1, further comprising a cover plate mounted on the chassis bending portion so as to face the integrated circuit chip.

9. The heat dissipating structure according to claim 8, further comprising a chip heat-dissipating sheet interposed between the integrated circuit chip and the cover plate.

10. A heat dissipating structure of an integrated circuit chip of a plasma display module, comprising:
   a chassis including a chassis base and a reinforcement member in which at least one protruding portion is formed, wherein the chassis base comprises a surface from which the reinforcement member extends;
   a circuit board formed on the surface of the chassis base; and
   the integrated circuit chip which is mounted on the reinforcement member and connected to a signal transmitting member, wherein the reinforcement member includes a mounting portion, a first bending portion which is bent and extends to the mounting portion, and a second bending portion which is bent and extends from the first bending portion, wherein the protruding portion is formed in the first bending portion, wherein the protruding portion is protruded in a direction substantially parallel with the surface of the chassis base, and wherein the protruding portion is formed between the circuit board and the integrated circuit chip.

11. The heat dissipating structure according to claim 10, wherein the reinforcement member is formed in an edge portion of the chassis.

12. A heat dissipating structure of an integrated circuit chip of a plasma display module, comprising:
   a chassis including a chassis base and a reinforcement member in which at least one protruding portion is formed; wherein the chassis base is substantially parallel with the plasma display module and
   the integrated circuit chip which is mounted on the reinforcement member and connected to a signal transmitting member, wherein the reinforcement member includes a mounting portion, a first bending portion which is bent and extends to the mounting portion, and a second bending portion which is bent and extends to the first bending portion, wherein the protruding portion is formed in the first bending portion, wherein the protruding portion is protruded toward a center portion of the chassis base, and wherein the protruding portion is formed by curving a portion of the first bending portion, and an air vent hole is formed in the side of the protruding portion and wherein the air vent hole is formed in a direction substantially perpendicular to the chase base.

13. A heat dissipating structure of an integrated circuit chip of a plasma display module, comprising:
   a chassis including a chassis base and a reinforcement member in which at least one protruding portion is formed, wherein the chassis base comprises a surface from which the reinforcement member extends;
   a circuit board formed on the surface of the chassis base; and
   the integrated circuit chip which is mounted on the reinforcement member and connected to a signal transmitting member, wherein the reinforcement member includes a mounting portion, a first bending portion which is bent and extends to the mounting portion, and a second bending portion which is bent and extends to the first bending portion, wherein the protruding portion is formed in the first bending portion, wherein the protruding portion is protruded in a direction substantially parallel with the surface of the chassis base, and wherein the protruding portion is formed between the circuit board and the integrated circuit chip.

14. The heat dissipating structure according to claim 1, wherein the protruding portion protrudes toward a center portion of the chassis base.

15. The heat dissipating structure according to claim 4, wherein the protruding portion protrudes toward a center portion of the chassis base.

16. The heat dissipating structure according to claim 10, wherein the protruding portion protrudes toward a center portion of the chassis base.

17. The heat dissipating structure according to claim 13, wherein the protruding portion protrudes toward a center portion of the chassis base.

* * * * *